(12) United States Patent
Koh et al.

(10) Patent No.: US 9,158,204 B2
(45) Date of Patent: Oct. 13, 2015

(54) PHOTO LITHOGRAPHIC RINSE SOLUTION AND METHOD OF MANUFACTURING A SEMICONDUCTOR DEVICE USING THE SAME

(71) Applicant: SAMSUNG ELECTRONICS CO., LTD., Suwon-si, Gyeonggi-do (KR)

(72) Inventors: Chawon Koh, Gyeonggi-do (KR); Su Min Kim, Gyeonggi-do (KR); Hyunwoo Kim, Gyeonggi-do (KR); Hyojin Yun, Gyeonggi-do (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 26 days.

(21) Appl. No.: 13/962,173

(22) Filed: Aug. 8, 2013

(65) Prior Publication Data
US 2014/0045335 A1 Feb. 13, 2014

(30) Foreign Application Priority Data
Aug. 8, 2012 (KR) .................... 10-2012-0086810

(51) Int. Cl.
*G03F 7/42* (2006.01)
*G03F 7/40* (2006.01)
*H01L 21/02* (2006.01)

(52) U.S. Cl.
CPC *G03F 7/426* (2013.01); *G03F 7/40* (2013.01); *H01L 21/0206* (2013.01)

(58) Field of Classification Search
CPC ........ G03F 7/42; G03F 7/426; H01L 21/0206
See application file for complete search history.

(56) References Cited

U.S. PATENT DOCUMENTS

| | | | |
|---|---|---|---|
| 6,602,654 B2 | 8/2003 | Iwata et al. | |
| 7,129,199 B2 | 10/2006 | Zhang et al. | |
| 7,521,405 B2 | 4/2009 | Zhang et al. | |
| 7,563,753 B2 | 7/2009 | Lee et al. | |
| 7,591,270 B2 | 9/2009 | Zhang et al. | |
| 7,811,748 B2 | 10/2010 | Koshiyama et al. | |
| 7,897,325 B2 | 3/2011 | Sawada et al. | |
| 2005/0233921 A1 | 10/2005 | Lee et al. | |
| 2006/0097218 A1* | 5/2006 | Mori et al. | 252/79.1 |
| 2006/0246382 A1 | 11/2006 | Lee et al. | |
| 2009/0246956 A1* | 10/2009 | Takamiya et al. | 438/693 |
| 2010/0178767 A1* | 7/2010 | Schubert et al. | 438/692 |

FOREIGN PATENT DOCUMENTS

| | | |
|---|---|---|
| JP | 2008-310315 | 12/2008 |
| JP | 2010-134406 | 6/2010 |
| KR | 10-2003-0045471 A | 6/2003 |
| KR | 10-2007-0017018 A | 2/2007 |
| KR | 10-2010-0138541 A | 12/2010 |

* cited by examiner

*Primary Examiner* — Brittany Raymond
(74) *Attorney, Agent, or Firm* — Lee & Morse, P.C.

(57) ABSTRACT

A photolithographic rinse solution includes deionized water, and a surfactant, the surfactant including a cyclic amine group and at least one non-amine cyclic group joined to or fused with the cyclic amine group, wherein the cyclic amine group includes a ring having a carbon number of 4 to 6, and the non-amine cyclic group includes a ring having a carbon number of 5 to 8.

16 Claims, 4 Drawing Sheets

PHOTO LITHOGRAPHIC RINSE SOLUTION AND METHOD OF MANUFACTURING A SEMICONDUCTOR DEVICE USING THE SAME

CROSS-REFERENCE TO RELATED APPLICATION

Korean Patent Application No. 10-2012-0086810, filed on Aug. 8, 2012, in the Korean Intellectual Property Office, and entitled: "Photo Lithographic Rinse Solution and Method of Manufacturing A Semiconductor Device Using the Same," is incorporated by reference herein in its entirety.

BACKGROUND

1. Field

Embodiments relate to a photolithographic rinse solution and methods of manufacturing a semiconductor device using the same.

2. Description of the Related Art

High speed and/or low voltage semiconductor devices have been desirable for high speed and lower power consumption electronic devices. The semiconductor devices have become more highly integrated. Microfabrication techniques such as photolithographic techniques have been developed for improving the integration degree of the semiconductor devices.

SUMMARY

Embodiments are directed to a photolithographic rinse solution including deionized water and a surfactant. The surfactant includes a cyclic amine group and at least one non-amine cyclic group fused with the cyclic amine group. The cyclic amine group includes a ring having a carbon number of 4 to 6. The non-amine cyclic group includes a ring having a carbon number of 5 to 8.

The cyclic amine group may be represented by one of the following chemical formulas 1 and 2,

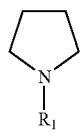

[chemical formula 1]

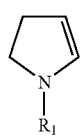

[chemical formula 2]

where "$R_1$" denotes hydrogen or an alkyl group having a carbon number of 1 to 10.

The non-amine cyclic group may be an aromatic ring group or an alicyclic group.

The surfactant may further include an ester group joined to the cyclic amine group.

The cyclic amine group having the ester group joined thereto may be represented by one of the following chemical formulas 3, 4, and 5,

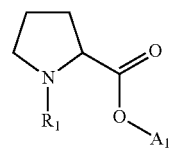

[chemical formula 3]

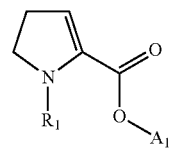

[chemical formula 4]

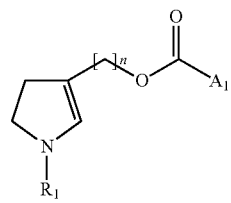

[chemical formula 5]

where "$A_1$" denotes —$Z_1$ or —C(=O)—$Z_2$, each of "$Z_1$" and "$Z_2$" denotes an alkyl group having a carbon number of 2 to 31 or an alkyl group substituted with fluorine, "$R_1$" denotes hydrogen or an alkyl group having a carbon number of 1 to 10, and "n" denotes an integer of 1 to 20.

The surfactant may further include an aliphatic group joined to the ester group.

The surfactant may be represented by one of the following chemical formulas 6 to 10,

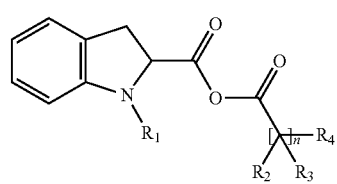

[chemical formula 6]

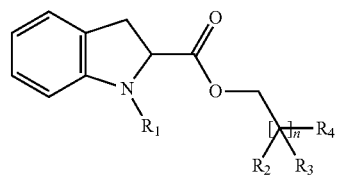

[chemical formula 7]

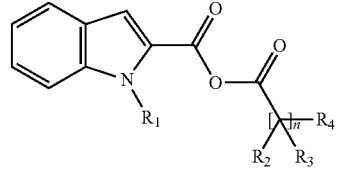

[chemical formula 8]

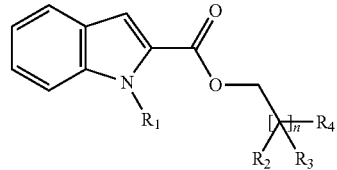

[chemical formula 9]

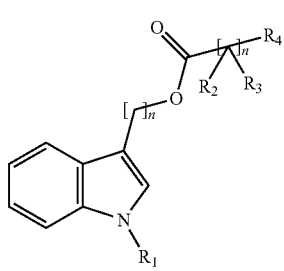

[chemical formula 10]

where "$R_1$" denotes hydrogen or an alkyl group having a carbon number of 1 to 10, "$R_2$" denotes hydrogen or fluorine, "$R_3$" denotes hydrogen or fluorine, "$R_4$" denotes hydrogen, fluorine, or an alkyl group having a carbon number of 1 to 10, and "n" denotes an integer of 1 to 20.

A concentration of the surfactant in the photolithographic rinse solution may be within a range of about 0.01 wt % to about 1.0 wt %.

The photolithographic rinse solution may further include a fluorine-based non-ionic surfactant or a fluorine-based negative ionic surfactant.

The photolithographic rinse solution may further include one of ethanol, isopropanol, and t-butyl alcohol.

Embodiments are also directed to a method of manufacturing a semiconductor device, the method including coating a photoresist on a substrate, performing an exposure process and a development process on the photoresist to form a photoresist pattern, and cleaning the developed photoresist pattern with a rinse solution, in which the development process is a negative-tone development (NTD) process. The rinse solution includes an organic solvent.

The organic solvent may include one of acetone, ethanol, isopropanol, n-decane (DEC), n-heptane, n-hexane, n-octane, perfluoroheptane, perfluorohexane, or perfluorooctane.

The organic solvent may have a surface tension within a range of about 5 mN/m to about 25 mN/m.

The rinse solution may include one of acetone, n-decane (DEC), n-heptane, n-hexane, n-octane, perfluoroheptane, perfluorohexane, or perfluorooctane. The rinse solution may further include one of ethanol, isopropanol, or t-butyl alcohol.

Embodiments are also directed to a method of manufacturing a semiconductor device, the method including coating a photoresist on a substrate, performing an exposure process and a development process on the photoresist to form a photoresist pattern, and cleaning the developed photoresist pattern with the photolithographic rinse solution including the surfactant that includes a cyclic amine group and at least one non-amine cyclic group joined to or fused with the cyclic amine group, as described above.

Embodiments are also directed to a photolithographic rinse solution including deionized water, and a surfactant, the surfactant being a polycyclic amine compound substituted with an ester group.

The polycyclic amine compound may include a cyclic amine group and at least one non-amine cyclic group fused with the cyclic amine group, the amine group being substituted with the ester group.

The polycyclic amine compound substituted with an ester group may be represented by one of the following chemical formulas 6 to 10,

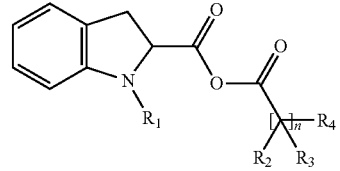

[chemical formula 6]

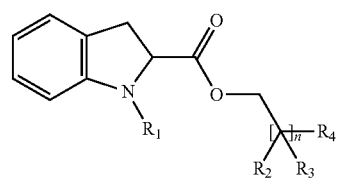

[chemical formula 7]

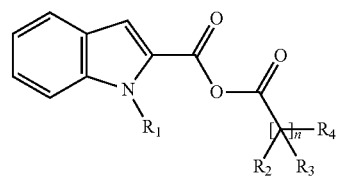

[chemical formula 8]

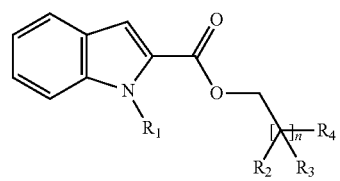

[chemical formula 9]

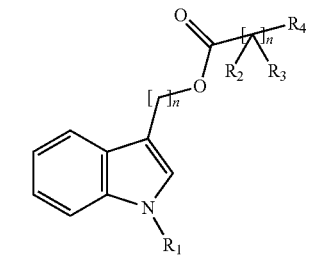

[chemical formula 10]

where "$R_1$" denotes hydrogen or an alkyl group having a carbon number of 1 to 10, each of "$R_2$" and "$R_3$" denotes hydrogen or fluorine, "$R_4$" denotes hydrogen, fluorine, or an alkyl group having a carbon number of 1 to 10, and "n" denotes an integer of 1 to 20.

The polycyclic amine compound substituted with an ester group may be represented by one of the following chemical formulas 11 to 13:

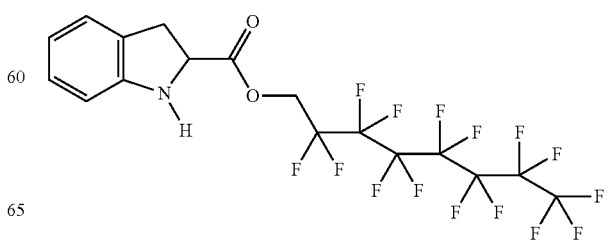

[chemical formula 11]

-continued

[chemical formula 12]
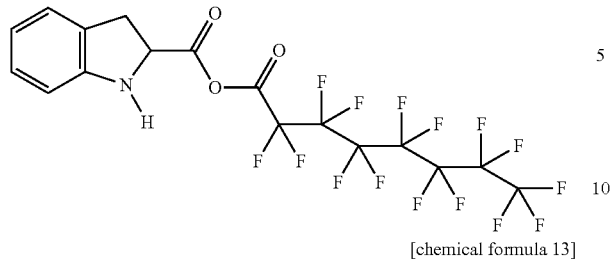

[chemical formula 13]
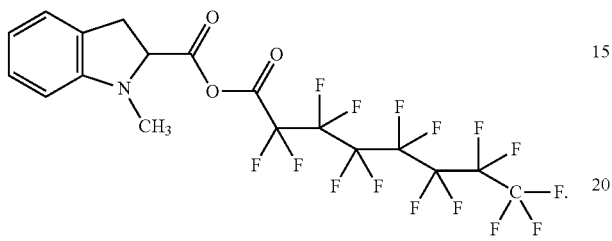

The photolithographic rinse solution may be for cleaning a developed photoresist pattern.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
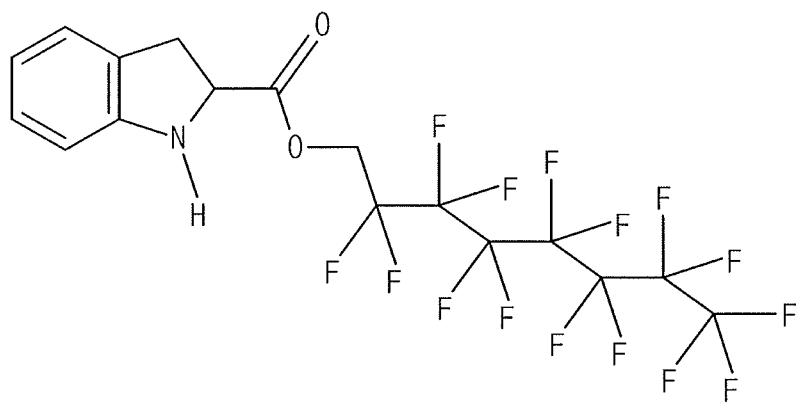
FIGS. 1 to 3 illustrate molecule structural formulas of surfactants according to exemplary embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items.

According to some embodiments, a photolithographic rinse solution includes deionized water (DI water) and a surfactant. The surfactant may have a concentration within a range of about 0.01 wt % to about 1.0 wt % in the photolithographic rinse solution.

The surfactant may be a surfactant compound that includes cyclic amine group and a non-amine cyclic group joined to or fused with the cyclic amine group. The cyclic amine group may include a ring having a carbon number of 4 to 6. For example, the cyclic amine group may be expressed as one of the following chemical formulas 1 and 2.

[chemical formula 1]
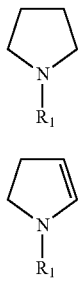

[chemical formula 2]
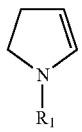

In chemical formulas 1 and 2, "$R_1$" denotes hydrogen, or an alkyl group having a carbon number of 1 to 10. The non-amine cyclic group joined to the cyclic amine group may include a ring having a carbon number of 5 to 8. The non-amine cyclic group may be an aromatic ring group or an alicyclic group. For example, the non-amine cyclic group may be a benzene group or a cyclohexane group. The cyclic amine group may be a bulky cyclic amine group combined with at least one of the non-amine cyclic group.

The surfactant compound may further include an ester group connected to the cyclic amine. For example, the cyclic amine group connected to the ester group may be expressed as one of the following chemical formulas 3, 4, and 5.

[chemical formula 3]
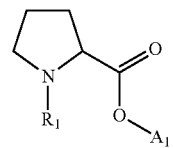

[chemical formula 4]
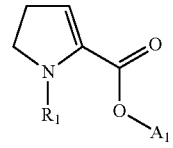

[chemical formula 5]
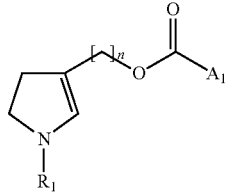

In chemical formulas 3, 4, and 5, "$A_1$" denotes —$Z_1$ or —C(=O)—$Z_2$, each of "$Z_1$" and "$Z_2$" denotes an alkyl group having a carbon number of 2 to 31, the alkyl group being unsubstituted or substituted with fluorine, "$R_1$" denotes hydrogen or an alkyl group having a carbon number of 1 to 10, and "n" denotes an integer of 1 to 20. The ester group may connect a hydrophilic group (N) in the cyclic amine to a hydrophobic group described below.

In chemical formulae 1 through 5, it is to be understood that the non-amine cyclic group may be joined to or fused with the cyclic amine group at any suitable ring position(s) on the cyclic amine.

The surfactant compound may further include an aliphatic compound combined with the ester group.

The surfactant compound may be expressed as one of the following chemical formulas 6 to 10.

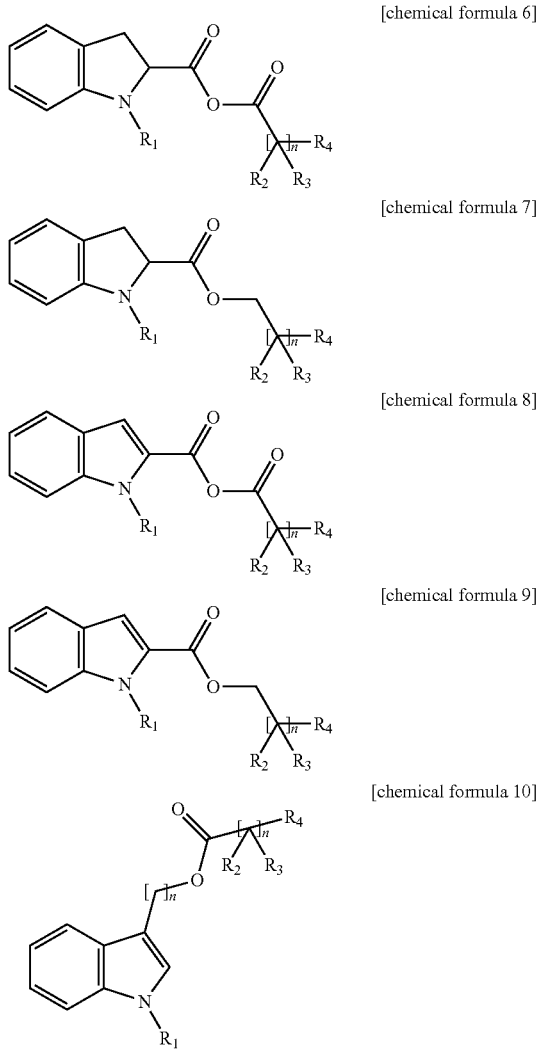

[chemical formula 6]

[chemical formula 7]

[chemical formula 8]

[chemical formula 9]

[chemical formula 10]

In chemical formulas 6 to 10, "$R_1$" denotes hydrogen or an alkyl group having a carbon number of 1 to 10, each of "$R_2$" and "$R_3$" denotes hydrogen or fluorine, "$R_4$" denotes hydrogen, fluorine, or an alkyl group having a carbon number of 1 to 10, and "n" denotes an integer of 1 to 20. Nitrogen (N) in the cyclic amine may have hydrophilicity. The $R_2$, $R_3$, and $R_4$ in the aliphatic group combined with the ester group may have hydrophobicity.

Furthermore, in chemical formulas 6 through 10, it may be understood that a cyclohexane group, for example, may be joined to or fused with the cyclic amine group at any suitable ring position(s) on the cyclic amine, instead of the benzene group joined to or fused with the cyclic amine group.

Figure 2:
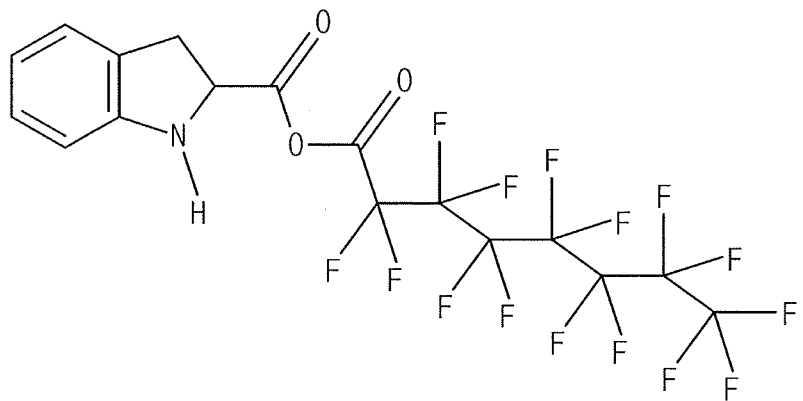
Figure 3:
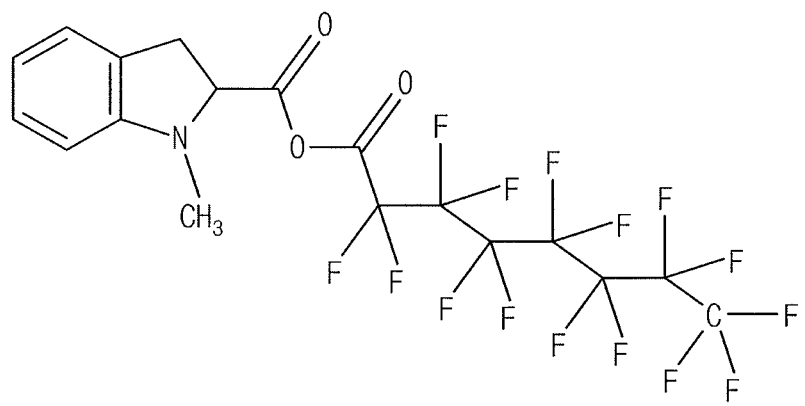

FIGS. 1 to 3 illustrate structural formulas of surfactant compounds according to some embodiments. (The structural formulas are also referred to herein as chemical formulas 11 to 13.) Referring to FIGS. 1 to 3, each of the surfactants according to some embodiments may include a cyclic amine group fused with a benzene ring, forming, for example, an indoline group, and a fluorine-based aliphatic group connected the cyclic amine group by way of the ester group. The molecule structural formula illustrated in FIG. 1 represents a surfactant compound in which $R_1$ is hydrogen and an alkyl group partially substituted with fluorine is joined the cyclic amine group by way of an ester group. The molecule structural formula illustrated in FIG. 2 represents a surfactant compound which $R_1$ is hydrogen and in which an alkyl group substituted with fluorine is joined to the cyclic amine group by way of a carbonyl group and an ester group. The molecule structural formula illustrated in FIG. 3 represents a surfactant compound in which the $R_1$ is $CH_3$ and which an alkyl group substituted with fluorine is joined with the cyclic amine group by way of a carbonyl group and an ester group. Nitrogen and fluorine in the surfactant compounds may function as a hydrophilic moiety and the hydrophobic moiety, respectively.

According to an embodiment, DI water including the surfactant may be used as a photolithographic rinse solution, thereby lessening the possibility of collapse of a photoresist pattern.

A width of the photoresist pattern may be made smaller in order to provide high integration of a semiconductor device. However, the photoresist pattern may be kept at a predetermined thickness for etching a lower layer under the photoresist pattern. Thus, an aspect ratio of the photoresist pattern may increase, increasing the risk that the photoresist pattern could collapse. A collapse of the photoresist pattern could occur, for example, as the result of a capillary force caused by the surface tension of a rinse solution used in a photolithography process.

Figure 4:
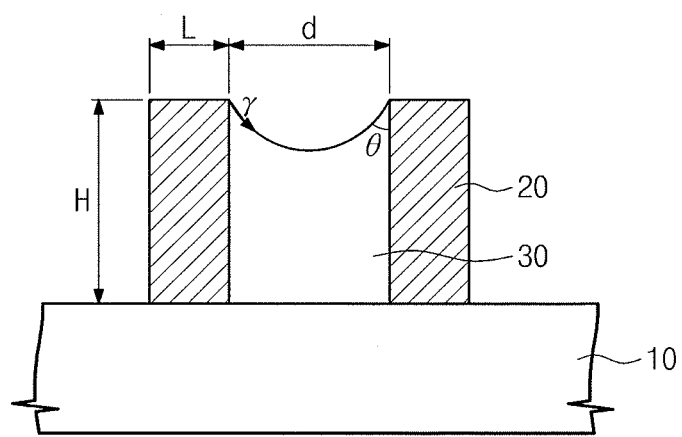
FIG. 4 a schematic cross-sectional view for explaining a cause of generating a collapse of a photoresist pattern.

FIG. 4 illustrates a schematic cross-sectional view for explaining a possible cause of a collapse of a photoresist pattern. Referring to FIG. 4, photoresist patterns 20 may be developed on a substrate 10. After the photoresist patterns 20 are developed, the photoresist patterns 20 may be cleaned by a photolithographic rinse solution 30. During this process, the rinse solution 30 may be present between the photoresist patterns 20. A capillary force applied to walls of the photoresist pattern 20 may be calculated with reference to FIG. 4 and equation 1:

$$\sigma = \frac{6\gamma\cos\theta}{d}\left(\frac{H}{L}\right)^2$$

[equation 1]

In equation 1, "H" denotes a height of the photoresist pattern 20, "L" denotes a width of the photoresist pattern 20, "d" denotes a distance between the patterns 20, "γ" denotes the surface tension of the rinse solution 30, "θ" denotes a contact angle of the pattern 20 and the rinse solution 30, and "δ" denotes a proportional constant. Referring to FIG. 4 and equation 1, it can be seen that the capillary force σ is proportional to the surface tension γ of the rinse solution 30. Thus, if the surface tension γ of the rinse solution 30 can be reduced, the risk of collapse of the photoresist pattern may be reduced.

The photolithographic rinse solution according to some embodiments may include a surfactant having a hydrophobic group for reducing the surface tension thereof. For example, the hydrophobic group in the surfactant may include fluorine. The surface tension may be related to an attractive force between molecules. The DI water may have a large surface tension due to hydrogen bonding between molecules thereof. On the other hand, the surfactant may have a small surface tension due to a small attractive force between the hydrophobic groups. When the surfactant including the hydrophobic groups is added to the DI water, the hydrophobic groups of the surfactant may be located on the surface of the rinse solution including the surfactant and the DI water. Thus, the surface of the rinse solution may be covered by the hydrophobic groups, so that the surface tension of the rinse solution may be reduced. As a result, it may be possible to prevent or minimize likelihood of collapse of the photoresist patterns.

Accordingly, the surfactant included in the photolithographic rinse solution may also prevent the photoresist pattern from dissolving. The surfactant may include the hydrophilic group in the form of a bulky compound. In an embodiment, the bulky compound may include a cyclic amine group and a non-amine cyclic group joined to or fused with the cyclic amine group (forming, for example, an indoline group). The surfactant may include a hydrophilic group in the form of the nitrogen (N) in the cyclic amine group. Nitrogen positive ions in the surfactant may react with negative ions (e.g., OH—) of a surface of the photoresist pattern, such that the surfactant may be drawn to penetrate the surface of the photoresist pattern. In this case, however, the surfactant may have steric hindrance due to the bulky cyclic amine group being combined with the non-amine cyclic group. The steric hindrance of the surfactant may restrain the rinse solution from penetrating the surface of the photoresist pattern, so that the dissolution of the photoresist pattern may be prevented or minimized. Additionally, the nitrogen positive ions in the bulky cyclic amine group may electrostatically interact with the negative ions (e.g., OH—) of the surface of the photoresist pattern, such that the surfactant may be adsorbed on the surface of the photoresist pattern. As a result, line width roughness (LWR) of the surface of the photoresist pattern can be improved.

The photolithographic rinse solution according to some embodiments may further include a fluorine-based non-ionic surfactant or a fluorine-based negative ionic surfactant. For example, the fluorine-based non-ionic surfactant may be $RfCH_2CH_2$—O—$(CH_2CH_2O)_xH$ (where "x" denotes an integer of 0 to 20, "Rf" denotes $F(CF_2CF_2)y$, and "y" denotes an integer of 1 to 10). The fluorine-based non-ionic surfactant or the fluorine-based negative ionic surfactant may have a concentration of about 0.01 wt % to about 1.0 wt % in the photolithographic rinse solution. The fluorine-based non-ionic surfactant or the fluorine-based negative ionic surfactant may be added for increasing solubility of the surfactant including the cyclic amine group in the photolithographic rinse solution.

The photolithographic rinse solution according to some embodiments may further include alcohol. For example, the alcohol may be one of ethanol, isopropanol, and t-butyl alcohol. The alcohol may have a concentration of about 0.1 wt % to about 10 wt % in the photolithographic rinse solution. The alcohol may be added for solvating and then removing a residue of the photoresist.

Figure 5:
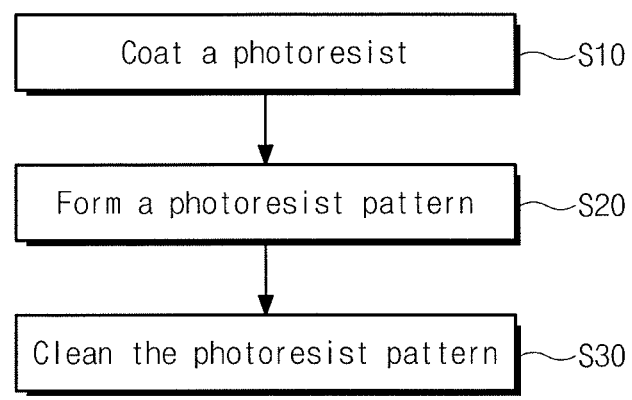
FIG. 5 illustrates a flowchart illustrating a method of manufacturing a semiconductor device using a photolithographic rinse solution according to exemplary embodiments.

FIG. 5 illustrates a flowchart showing a method of manufacturing a semiconductor device using a photolithographic rinse solution according to exemplary embodiments. Referring to FIG. 5, a photoresist may be coated on a substrate (S10). An exposure process and a development process may be performed on the photoresist coated on the substrate to form a photoresist pattern (S20). A light source used in the exposure process may be an extreme ultraviolet ray (EUV), and the development process may be a positive-tone development (PTD) process. After the formation of the photoresist pattern, the photoresist pattern may be cleaned using the rinse solution according to embodiments (S30). Thus, it may be possible to prevent or minimize likelihood of the collapse and dissolution phenomenon and to improve the line width roughness (LWR).

According to other embodiments, a photolithographic rinse solution may include an organic solvent. For example, the organic solvent may include one of acetone, ethanol, isopropanol, n-decane (DEC), n-heptane, n-hexane, n-octane, perfluoroheptane, perfluorohexane, and perfluorooctane. The organic solvent may have a low surface tension within a range of about 5 mN/m to about 25 mN/m.

According to this embodiment, the photolithographic rinse solution includes the organic solvent having the low surface tension. Accordingly, it may be possible to prevent or minimize the collapse of the photoresist pattern. As described above, a photoresist pattern may be at risk of collapse due to the capillary force caused by the surface tension of the rinse solution. In contrast, according to this embodiment, the photolithographic rinse solution may include the organic solvent that provides a low surface tension within the range of about 5 mN/m to about 25 mN/m. Accordingly, it may be possible to prevent or minimize the collapse of the photoresist pattern.

The photolithographic rinse solution according to this embodiment may further include alcohol. For example, if the photolithographic rinse solution includes one of the above organic solvents other than ethanol or isopropanol (such as, for example, acetone, ethanol, isopropanol, n-decane (DEC), n-heptane, n-hexane, n-octane, perfluoroheptane, perfluorohexane, or perfluorooctane), the photolithographic rinse solution may further include an alcohol. For example, the alcohol may be one of ethanol, isopropanol, and t-butyl alcohol may have a concentration within a range of about 0.1 wt % to about 10 wt % in the photolithographic rinse solution. The alcohol may be added to the photolithographic rinse solution for solving and then removing a residue of the photoresist.

Referring to FIG. 5, a photoresist may be coated on a substrate (S10), and then an exposure process and a development process may be performed on the photoresist coated on the substrate to form a photoresist pattern (S20). A light source of the exposure process may be an extreme ultraviolet ray (EUV), and the development process may be a negative-tone development (NTD) process. After the formation of the photoresist pattern, the photoresist pattern may be cleaned by the photolithographic rinse solution according to above-described embodiments (S30). The photolithographic rinse solution according to the above-described embodiments may be used to clean the photoresist pattern formed by the NTD process. Accordingly, it may be possible to prevent or reduce the likelihood of collapse of the photoresist pattern formed by the NTD process.

Figure 6:
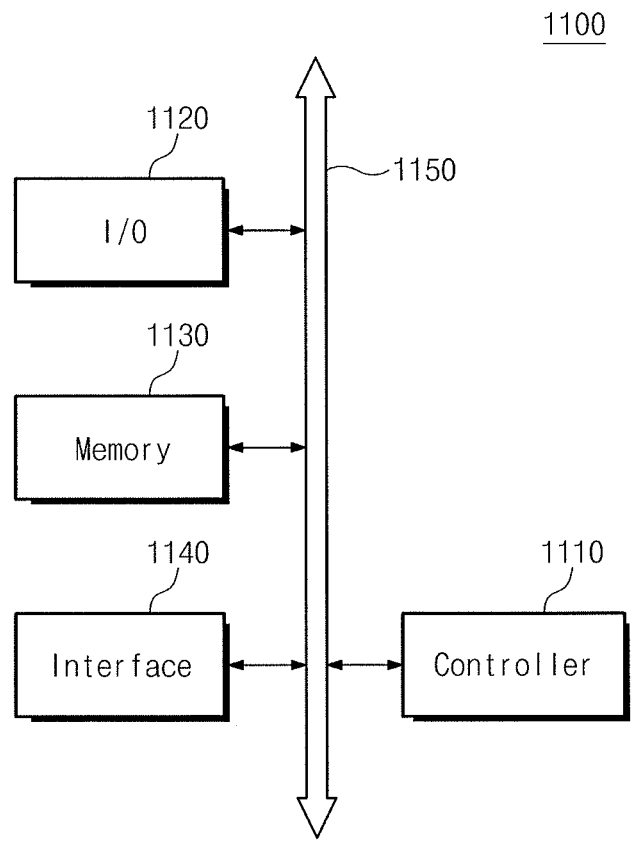
FIG. 6 illustrates a schematic block diagram illustrating an example of electronic systems including semiconductor device according to exemplary embodiments.

FIG. 6 illustrates a schematic block diagram depicting an example of an electronic system including a semiconductor device that is manufactured according to exemplary embodiments.

Referring to FIG. 6, an electronic system 1100 according to an embodiment may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, or other logic devices having a similar function to any one of the microprocessor, the digital signal processor and the microcontroller. The I/O unit 1120 may include a keypad, a keyboard and/or a display unit. The memory device 1130 may store data and/or commands. The memory device 1130 may include at least one semiconductor device manufactured using the photolithographic rinse solution according to embodiments. The memory device 1130 may further include a type of semiconductor memory device that is different from the semiconductor devices described above. The interface unit 1140 may operate by wireless or cable. For example, the interface unit 1140 may include an antenna for wireless communication or a transceiver for cable communication.

The electronic system 1100 may be applied to a personal digital assistant (PDA), a portable computer, a web tablet, a wireless phone, a mobile phone, a digital music player, a memory card or other electronic products. The other electronic products may receive or transmit information data by wireless communication.

Figure 7:
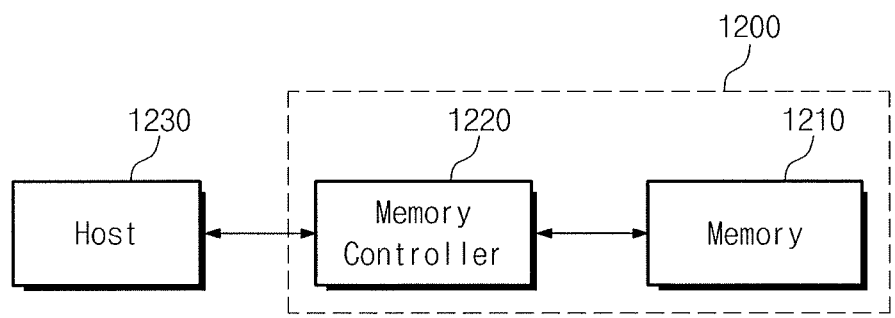
FIG. 7 illustrates a schematic block diagram illustrating an example of memory cards including semiconductor device according to exemplary embodiments.

FIG. 7 illustrates a schematic block diagram depicting an example of memory cards including semiconductor device according to exemplary embodiments.

Referring to FIG. 7, a memory card 1200 according to an embodiment may include a memory device 1210. The memory device 1210 may include at least one semiconductor device manufactured according to the embodiments described above. The memory device 1210 may further include a type of semiconductor memory device that is different from the semiconductor devices manufactured according to the embodiments described above. The memory card 1200 may further include a memory controller 1220 that controls data communication between a host 1230 and the memory device 1210.

According to embodiments, the photolithographic rinse solution may prevent or reduce the likelihood of collapse and dissolution of the photoresist pattern and may improve the line width roughness (LWR) of the photoresist pattern.

By way of summation and review, a photolithographic technique may be used for defining fine electronic circuits on a substrate when the semiconductor devices are formed. In a photolithographic technique, light may be irradiated to a photoresist coated on a substrate through a mask having printed circuit patterns, so that the circuit patterns of the mask are projected on the substrate. G-line, I-line, KrF, or ArF light sources may be used as the light source in the photolithographic technique. Recently, as the electronic circuit patterns have become finer, extreme ultraviolet rays (EUV) have been used as the light source to form fine and sophisticated photoresist patterns.

As the widths of photoresist patterns in semiconductor devices has been reduced with the high integration of the semiconductor devices, the thicknesses of the photoresist patterns have maintained predetermined values for etching lower layers. Thus, the aspect ratio of photoresist patterns has rapidly increased. Due to high aspect ratios, there is a greater risk that photoresist patterns could lean and/or collapse. After a photoresist pattern is developed using a developing solution, the photoresist pattern may be cleaned using deionized water to remove the developing solution. However, deionized water that is present between photoresist patterns may have a high surface tension, such that a laterally attractive force may occur between the photoresist patterns. Thus, photoresist patterns cleaned with only deionized water may susceptible to leaning or collapsing. Additionally, the photoresist patterns may be susceptible to collapsing due to a capillary force caused by the surface tension of a rinse solution when the rinse solution between the photoresist patterns is dried by a spin method after the developing process.

A surfactant may be added into a rinse solution for minimizing the collapse of the photoresist patterns. However, a surfactant may penetrate a surface of the photoresist pattern to cause a pattern dissolving phenomenon.

In contrast, embodiments provide a photolithographic rinse solution that may prevent a collapse of a photoresist pattern.

Embodiments also provide photolithographic rinse solution that may prevent the dissolution of a photoresist pattern and may improve the line width roughness of the photoresist pattern.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A photolithographic rinse solution, comprising:
deionized water; and
a surfactant, the surfactant including a cyclic amine group, at least one non-amine cyclic group fused with the cyclic amine group, and an ester group joined to the cyclic amine group,
wherein the cyclic amine group includes a ring having a carbon number of 4 to 6; and
the non-amine cyclic group includes a ring having a carbon number of 5 to 8.

2. The photolithographic rinse solution as claimed in claim 1, wherein the non-amine cyclic group is an aromatic ring group or an alicyclic group.

3. The photolithographic rinse solution as claimed in claim 1, wherein the cyclic amine group having the ester group joined thereto is represented by one of the following chemical formulas 3, 4, and 5,

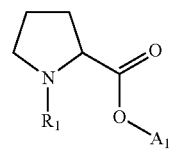

[chemical formula 3]

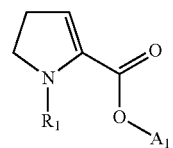

[chemical formula 4]

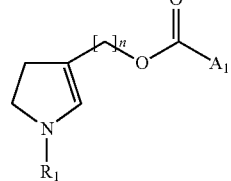

[chemical formula 5]

where "$A_d$" denotes —$Z_1$ or —C(=O)—$Z_2$, each of "$Z_1$" and "$Z_2$" denotes an alkyl group having a carbon number of 2 to 31 or an alkyl group substituted with fluorine, "$R_1$" denotes hydrogen or an alkyl group having a carbon number of 1 to 10, and "n" denotes an integer of 1 to 20.

4. The photolithographic rinse solution as claimed in claim 1, wherein the surfactant further includes an aliphatic group joined to the ester group.

5. The photolithographic rinse solution as claimed in claim 4, wherein the surfactant is represented by one of the following chemical formulas 6 to 10,

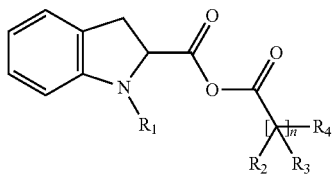

[chemical formula 6]

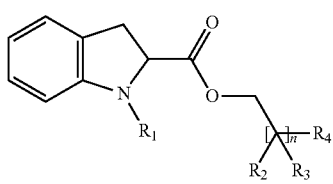

[chemical formula 7]

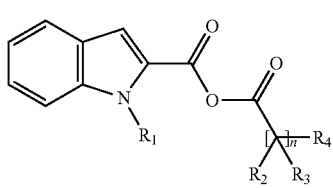

[chemical formula 8]

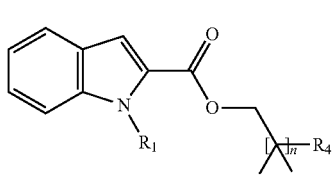

[chemical formula 9]

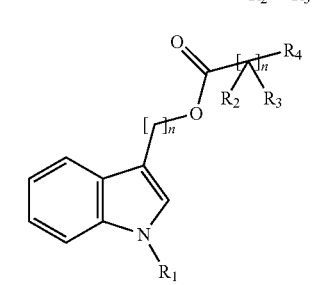

[chemical formula 10]

where "$R_1$" denotes hydrogen or an alkyl group having a carbon number of 1 to 10, "$R_2$" denotes hydrogen or fluorine, "$R_3$" denotes hydrogen or fluorine, "$R_4$" denotes hydrogen, fluorine, or an alkyl group having a carbon number of 1 to 10, and "n" denotes an integer of 1 to 20.

6. The photolithographic rinse solution as claimed in claim 1, wherein a concentration of the surfactant in the photolithographic rinse solution is within a range of about 0.01 wt % to about 1.0 wt %.

7. The photolithographic rinse solution as claimed in claim 1, further comprising:
a fluorine-based non-ionic surfactant or a fluorine-based negative ionic surfactant.

8. The photolithographic rinse solution as claimed in claim 1, further comprising:
alcohol including one of ethanol, isopropanol, or t-butyl alcohol.

9. A photolithographic rinse solution consisting of:
deionized water;
surfactant including a polycyclic amine compound;
optional fluorine-based surfactant; and
optional alcohol,
wherein:
the polycyclic amine compound includes a cyclic amine group and at least one non-amine cyclic group fused with the cyclic amine group; and
the cyclic amine group is represented by one of the following chemical formulas 1 and 2,

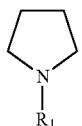

[chemical formula 1]

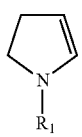

[chemical formula 2]

where "$R_1$" denotes hydrogen or an alkyl group having a carbon number of 1 to 10.

10. A photolithographic rinse solution as consisting of:
deionized water;
surfactant including a polycyclic amine compound;
optional fluorine-based surfactant; and
optional alcohol,
wherein:
the polycyclic amine compound includes a cyclic amine group and at least one non-amine cyclic group fused with the cyclic amine group; and
the surfactant further includes an ester group joined to the cyclic amine group.

11. A method of manufacturing a semiconductor device, the method comprising:
coating a photoresist on a substrate;
performing an exposure process and a development process on the photoresist to form a photoresist pattern; and
cleaning the developed photoresist pattern with the photolithographic rinse solution as claimed in claim 1.

12. A photolithographic rinse solution to the photoresist pattern including:
deionized water; and
a surfactant, the surfactant including a polycyclic amine compound substituted with an ester group.

13. The photolithographic rinse solution as claimed in claim 12, wherein the polycyclic amine compound includes a cyclic amine group and at least one non-amine cyclic group fused with the cyclic amine group, the cyclic amine group being substituted with the ester group.

14. The photolithographic rinse solution as claimed in claim 12, wherein the polycyclic amine compound substituted with an ester group is represented by one of the following chemical formulas 6 to 10,

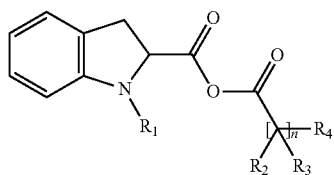
[chemical formula 6]

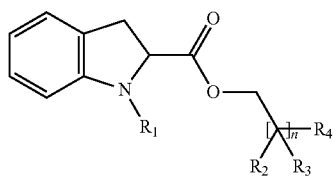
[chemical formula 7]

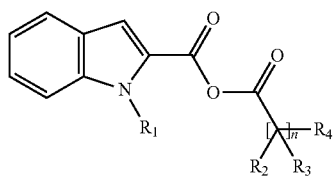
[chemical formula 8]

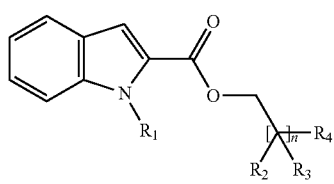
[chemical formula 9]

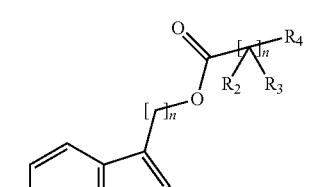
[chemical formula 10]

where "$R_1$" denotes hydrogen or an alkyl group having a carbon number of 1 to 10, each of "$R_2$" and "$R_3$" denotes hydrogen or fluorine, "$R_4$" denotes hydrogen, fluorine, or an alkyl group having a carbon number of 1 to 10, and "n" denotes an integer of 1 to 20.

15. The photolithographic rinse solution as claimed in claim 12, wherein the polycyclic amine compound substituted with an ester group is represented by one of the following chemical formulas 11 to 13:

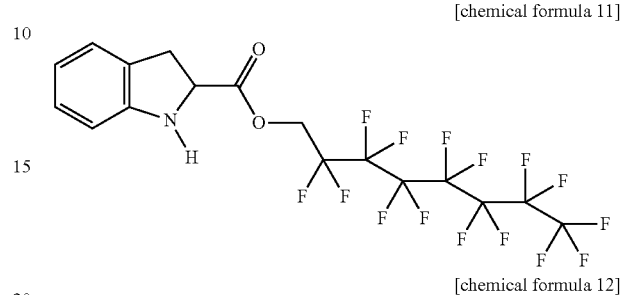
[chemical formula 11]

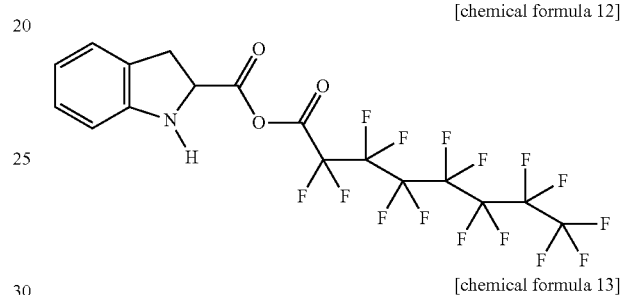
[chemical formula 12]

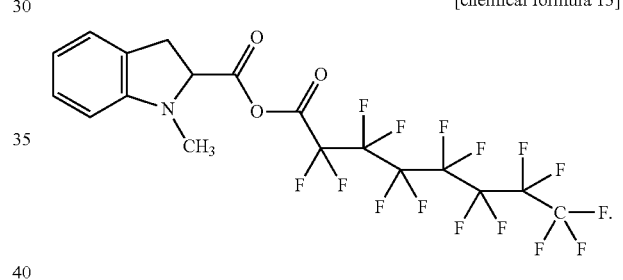
[chemical formula 13]

16. The photolithographic rinse solution as claimed in claim 12, wherein the photolithographic rinse solution is for cleaning a developed photoresist pattern.

* * * * *